US012741402B2

(12) United States Patent
Goto

(10) Patent No.: US 12,741,402 B2
(45) Date of Patent: Sep. 22, 2026

(54) METHOD FOR PRODUCING RESIN MOLDED PRODUCT, FILM FIXING MEMBER, LIQUID RESIN SPREADING MECHANISM AND RESIN MOLDING APPARATUS

(71) Applicant: TOWA CORPORATION, Kyoto (JP)

(72) Inventor: Tomoyuki Goto, Kyoto (JP)

(73) Assignee: TOWA CORPORATION, Kyoto (JP)

( * ) Notice: Subject to any disclaimer, the term of this patent is extended or adjusted under 35 U.S.C. 154(b) by 245 days.

(21) Appl. No.: 18/612,551

(22) Filed: Mar. 21, 2024

(65) Prior Publication Data

US 2024/0227251 A1 Jul. 11, 2024

Related U.S. Application Data

(63) Continuation of application No. PCT/JP2022/033183, filed on Sep. 2, 2022.

(30) Foreign Application Priority Data

Sep. 24, 2021 (JP) ................................ 2021-155803

(51) Int. Cl.
*B29C 41/12* (2006.01)
*B29L 31/34* (2006.01)
*H10P 72/00* (2026.01)

(52) U.S. Cl.
CPC .......... *B29C 41/12* (2013.01); *H10P 72/0441* (2026.01); *B29L 2031/3406* (2013.01)

(58) Field of Classification Search
CPC .... B29C 41/12; B29C 2045/0425; B05D 1/28
See application file for complete search history.

(56) References Cited

U.S. PATENT DOCUMENTS 4,668,334 A 5/1987 Doornveld
6,632,476 B2 10/2003 Nakamura
7,879,393 B2 2/2011 Ederer
9,842,828 B1 * 12/2017 Talledo ................ H01L 25/105
(Continued)

FOREIGN PATENT DOCUMENTS

JP 2003-165133 6/2003
JP 2011-147853 8/2011
(Continued)

*Primary Examiner* — Virak Nguon
(74) *Attorney, Agent, or Firm* — Muncy, Geissler, Olds & Lowe, P.C.

(57) ABSTRACT

A method for producing a resin molded product which does not use a spreading member for spreading a resin and achieves applying a liquid resin in a short time even when an area to be applied with the liquid resin is large. The method includes: applying liquid resin (21) on film (11), and performing resin molding with liquid resin (21) applied in the applying the liquid resin, wherein the applying the liquid resin includes: supplying the liquid resin (21) on a part of a surface of film (11) on a side to be applied with liquid resin (21), spreading liquid resin (21) on a surface of a side supplied with liquid resin (21) in film (11) by folding film (11) supplied with liquid resin (21) such that the side supplied with liquid resin (21) be inside, and opening film (11) folded in the spreading liquid resin (21).

8 Claims, 7 Drawing Sheets

(56) References Cited

U.S. PATENT DOCUMENTS

| | | | | |
|---|---|---|---|---|
| 2001/0033894 | A1* | 10/2001 | Nakamura | B05C 9/02 118/321 |
| 2017/0301580 | A1 | 10/2017 | Yoshihara | |
| 2021/0053258 | A1* | 2/2021 | Oi | H01L 21/565 |

FOREIGN PATENT DOCUMENTS

| | | | |
|---|---|---|---|
| JP | 2012-143724 | 8/2012 | |
| JP | 2017-196752 | 11/2017 | |
| JP | 2017196752 A * | 11/2017 | B29C 43/18 |
| JP | 2017-226202 | 12/2017 | |

* cited by examiner

METHOD FOR PRODUCING RESIN MOLDED PRODUCT, FILM FIXING MEMBER, LIQUID RESIN SPREADING MECHANISM AND RESIN MOLDING APPARATUS

TECHNICAL FIELD

The present invention relates to a method for producing a resin molded product, a film fixing member, a liquid resin spreading mechanism and a resin molding apparatus.

BACKGROUND ART

An electronic component such as an IC and a semiconductor electronic component is often molded to be used as a resin-sealed electronic component (resin molded product).

With regard to reducing unevenness of the thickness of a resin in applying a liquid resin, patent literature 1 describes, for example, supplying the liquid resin on an exposed surface of a work, bringing a spreading member into contact with the liquid resin, and spreading the liquid resin all over the exposed surface of the work.

Patent literature 2 describes, in applying a liquid resin for resin molding, ejecting the liquid resin at one point of the center or in a spiral shape on a film, and spreading the ejected liquid resin. Methods for spreading the ejected resin described in patent literature 2 are applying centrifugal force, blowing gas, and the like, for example.

CITATION LIST

Patent Literature

Patent Literature 1: JP-A-2011-147853
Patent Literature 2: JP-A-2017-196752

SUMMARY OF INVENTION

Technical Problem

However, in the method of patent literature 1, the liquid resin adheres to the spreading member, and this results in loss of the liquid resin. The adhesion of the liquid resin to the spreading member also results in a need of a process such as cleaning of the spreading member. Further, an amount of the liquid resin supplied to the work may fluctuate.

In contrast, spreading the liquid resin without using the spreading member as described in patent literature 2 causes no problem resulting from the use of the spreading member. However, it takes time to spread the liquid resin when the area to be applied with the liquid resin is large. For example, ejecting the liquid resin in a thin spiral shape needs a long time for ejection of the liquid resin. Ejecting the liquid resin at one point of the center on the film can save time for ejection of the liquid resin but needs a long time for spreading the ejected liquid resin. Because of this, after being conveyed to a molding die, the liquid resin may harden before reaching the end of the area to be applied with a liquid resin, for example.

The need of a long time for applying a liquid resin in this way makes it difficult to treat a large area to be applied with a liquid resin. Therefore, production of resin molded products needs a method of applying a liquid resin in a short time even when the area to be applied with a liquid resin is large.

Hence, it is an object of the present invention to provide a method for producing a resin molded product which does not need to use a spreading member to spread a resin and achieves applying a liquid resin in a short time even when the area to be applied with a liquid resin is large, a film fixing member used in the method, a liquid resin spreading mechanism used in the method, and a resin molding apparatus used in the method.

Solution to Problem

To achieve the above object, the present invention provides a method for producing a resin molded product using a liquid resin applied on a film, including: applying the liquid resin on the film, and performing resin molding with the liquid resin applied in the applying the liquid resin, wherein the applying the liquid resin includes: supplying the liquid resin on a part of a surface of the film on a side to be applied with the liquid resin; spreading the liquid resin on a surface of the film on a side supplied with the liquid resin, by folding the film supplied with the liquid resin such that the side supplied with the liquid resin be inside, and opening the film folded in the spreading the liquid resin.

The present invention also provides a film fixing member used in the method for producing a resin molded product of the present invention including fixing a film to the film fixing member, configured to fix the film, wherein a recessed part is formed on a side of the film fixing member where the film is fixed so as to correspond to a liquid resin applying area to be applied with the liquid resin.

The present invention also provides a liquid resin spreading mechanism configured to perform the spreading the liquid resin and the opening the film in the method for producing a resin molded product of the present invention, by spreading the liquid resin on a surface of the film on a side supplied with the liquid resin, by folding the film supplied with the liquid resin such that the side supplied with the liquid resin be inside, and opening the film folded in the spreading the liquid resin.

The present invention also provides a resin molding apparatus, including: the film fixing member or the liquid resin spreading mechanism of the present invention, and a molding die configured to perform resin molding with the liquid resin applied in the applying the liquid resin.

Advantageous Effects of Invention

The present invention can provide a method for producing a resin molded product which does not need to use a spreading member to spread a resin and achieves applying a liquid resin in a short time even when the area to be applied with a liquid resin is large, a film fixing member used in the method, a liquid resin spreading mechanism used in the method, and a resin molding apparatus used in the method.

BRIEF DESCRIPTION OF DRAWINGS

FIG. 1A is a plan view and FIG. 1B is a side view.

FIG. 4A is a plan view and FIG. 4B is a side view.

FIG. 5A is a plan view and FIG. 5B is a side view.

DESCRIPTION OF EMBODIMENTS

Figure 1A:
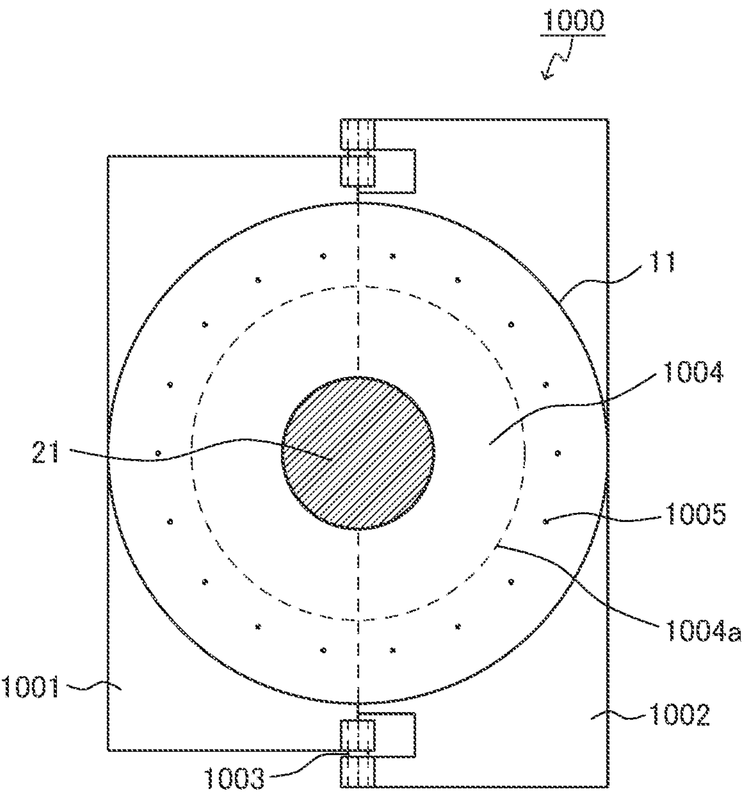
FIGS. 1A and 1B show a state where a film is fixed on a film fixing member and a liquid resin is supplied on the film.

The present invention will be described more specifically below with reference to illustrative examples. It is to be noted, however, that the present invention is by no means limited by the following descriptions.

In the present invention, a "liquid resin" is not particularly limited as long as having flowability and may be, for example, a flowable resin having flowability at a normal temperature (room temperature) or a molten resin. In the present invention, "flowable" means having flowability with such degree that the flowability exerts upon application of force, regardless of a level of the flowability, that is, a degree of viscosity. Thus, the "liquid resin" in the present invention refers to a resin having flowability with such degree that the flowability exerts upon application of force. In the present invention, a "molten resin" refers to a resin made to be liquid or flowable by melting, for example. A form of the molten resin is not particularly limited and is for example, a form capable of being supplied to a molding die cavity, a pot, and the like.

In the present invention, a "molding die" is not particularly limited, and examples thereof include a metal die and a ceramic die.

In the present invention, "compression molding" refers to molding performed by supplying a resin into a molding die cavity and applying force to the resin inside the cavity in a state where the molding die is clamped.

In the present invention, "applying" includes at least ejecting a liquid resin. "Applying" in the present invention may further include spreading the ejected liquid resin.

In the present invention, a film which is an applying object to be applied with a liquid resin is not particularly limited and may be a release film, for example.

In the present invention, a "film" is not particularly limited. A material of the film is not particularly limited in the present invention, and examples thereof include resin, metal and the like, and one kind of the material can be used, or two or more kinds of the materials can be used in combination. Examples of the resin include a polystyrene resin, a PET resin, a polymethylpentene resin and a fluororesin. Examples of the metal include aluminum and copper. In the present invention, the "film" may be, for example, a single layer or a laminate of a plurality of layers. The laminate may be a laminate of a resin layer and a metal layer or the like, for example. In general, one with a relatively small thickness may be called a "film", and one with a relatively large thickness may be called a "sheet" for distinction. However, in the present invention, there is no particular distinction and the thickness of the "film" is not limited.

In the spreading the liquid resin of the method for producing a resin molded product of the present invention, the film may be folded along a line passing through the center of a liquid resin supply area supplied with the liquid resin, for example. Note that, in the present invention, the "line passing through the center of the liquid resin supply area" may be a line passing through the exact center or the approximate center of the liquid resin supply area.

The method for producing a resin molded product of the present invention may be, for example, presetting a target thickness of the liquid resin after being spread, and in the spreading the liquid resin, spreading the liquid resin such that the thickness of the liquid resin after being spread be equal to the target thickness. Note that, in the present invention, "be equal to the target thickness" may be being exactly equal or approximately equal to the target thickness.

The method for producing a resin molded product may further include fixing the film to the film fixing member, and the film fixing member may have a recessed part formed on a side where the film is fixed so as to correspond to the liquid resin supply area to be applied with the liquid resin, for example.

In the method for producing a resin molded product of the present invention, the depth of the recessed part in the film fixing member may be, for example, set based on the target thickness of the liquid resin after being spread.

The film fixing member of the present invention may be openable and closable to fold the side where the film is fixed inward, for example. The spreading the liquid resin may be performed by folding the film fixing member, and the opening the film may be performed by opening the folded film fixing member, for example.

In the film fixing member of the present invention, the depth of the recessed part may be set based on the target thickness of the liquid resin after being spread, for example.

The liquid resin spreading mechanism of the present invention may perform the spreading the liquid resin using the film fixing member of the present invention, by folding the film fixing member fixing the film supplied with the liquid resin thereon, such that the side supplied with the liquid resin be inside to spread the liquid resin thereover, and may perform the opening the film by opening the film fixing member folded in the spreading the liquid resin, for example.

The resin molding apparatus of the present invention may further include a liquid resin supply mechanism configured to supply the liquid resin on the film, for example. The liquid resin supply mechanism may be, for example, an ejecting mechanism configured to eject the liquid resin on the film. The ejecting mechanism may further include a moving mechanism configured to move a position of the liquid resin ejection to the applying object. The moving mechanism may be an applying object moving mechanism configured to move the applying object so that the ejection position of the liquid resin is relatively moved to the applying object, for example. The applying object moving mechanism may move the applying object in a substantially horizontal direction, for example.

The resin molding apparatus of the present invention may include the liquid resin spreading mechanism of the present invention to spread the liquid resin supplied on the film as described above, for example. The liquid resin spreading mechanism may be, for example, configured to fold the film supplied with the liquid resin and open the folded film as described above. The liquid resin spreading mechanism may be, for example, configured to fold the film fixing member fixing the film supplied with the liquid resin thereon and open the folded film fixing member as described above.

In the resin molding apparatus of the present invention, for example, the ejecting mechanism and the resin molding mechanism may each be a different module, and may be detachable to each other.

The resin molding apparatus of the present invention may include a plurality of the resin molding mechanisms, each of the plurality of the resin molding mechanisms may each be a different module, the ejecting mechanism and the plurality of the resin molding mechanisms may each be a different module, and at least one of the ejecting mechanism or among the plurality of the resin molding mechanisms may be mutually detachable to another at least one of the mechanisms, for example.

The resin molding apparatus of the present invention may include a controller configured to perform control with a computer program. The controller may control operation of at least one of the moving mechanism or the liquid resin spreading mechanism, for example.

The supplying the liquid resin of the method for producing a resin molded product of the present invention may be, for example, ejecting the liquid resin on a part of a surface of the film on a side to be applied with the liquid resin. The ejecting may further include moving the ejection position of the liquid resin relatively to the applying object, for example.

The method for producing a resin molded product of the present invention may further include conveying the film which is the applying object to be applied with the liquid resin, to a spot for performing compression molding, for example.

The method for producing a resin molded product of the present invention may include cutting the film which is the applying object to be applied with the liquid resin, and the liquid resin may be ejected on the film cut in the cutting the film, for example.

In the ejecting of the method for producing a resin molded product of the present invention, for example, the ejection position of the liquid resin may be moved relatively to the applying object. In this case, for example, the applying object may be moved so that the ejection position of the liquid resin is relatively moved to the applying object.

In the method for producing a resin molded product of the present invention and the resin molding apparatus of the present invention, for example, the liquid resin applying area to be applied with the liquid resin may be a substantially circular shape, a substantially rectangular shape, or a substantially square shape.

In the method for producing a resin molded product of the present invention, for example, the ejecting may be performed in a state where the film which is an applying object to be applied with the liquid resin is fixed on a film fixation base. The film may be the release film, as described above.

In the method for producing a resin molded product of the present invention, the ejecting and the performing resin molding may be performed at different spots, and before the performing resin molding, conveying the applying object to a spot for the performing resin molding may be performed, for example. Note that, the conveying may be performed while spreading the liquid resin, in other words, in parallel with the spreading the liquid resin, or may be performed in a state where the liquid resin is spread, in other words, after the spreading the liquid resin, for example.

A method for producing an electronic component in the present invention is the method for producing a resin molded product of the present invention in which the resin molded product is an electronic component, and the electronic component is produced by resin sealing a chip by compression molding in the performing resin molding.

In general, an "electronic component" may refer to a chip before resin sealing or a resin-sealed chip. However, in the present invention, mere use of the "electronic component" refers to the resin-sealed chip as an electronic component (electronic component as a completed product), unless otherwise stated. In the present invention, the "chip" refers to a chip in which at least a part thereof is not resin-sealed and exposed, including a chip before resin sealing, a partially resin-sealed chip, and a plurality of chips including at least one exposed chip being not resin-sealed.

The examples of the present invention are described below with reference to the drawings. Each drawing is schematically illustrated by appropriately omitting, exaggerating, and the like for convenience in explanation.

EXAMPLES

Example 1

The present example describes an example of the film fixing member of the present invention and the method for producing a resin molded product of the present invention using the film fixing member.

Figure 1B:
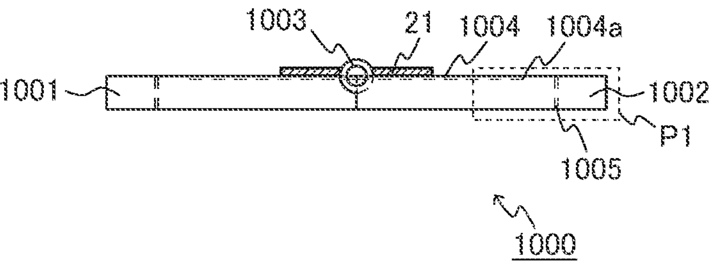

The film fixing member of the present example will be described with reference to FIGS. 1A and 1B. FIGS. 1A and 1B show an entire structure of this film fixing member 1000. FIG. 1A is a plan view and FIG. 1B is a side view viewed from the lower direction on the paper surface in FIG. 1A. FIGS. 1A and 1B show a state where a film 11 is fixed to the film fixing member 1000, and a liquid resin 21 is supplied on a surface of the fixed film 11. As shown in FIGS. 1A and 1B, main components of this film fixing member 1000 are an opening and folding member 1001 and a fixed side member 1002. Specifically, the film fixing member 1000 is configured with separate two members which are the opening and folding member 1001 and the fixed side member 1002. The left half of FIG. 1A forms the opening and folding member 1001 and the right half forms the fixed side member 1002. The opening and folding member 1001 and the fixed side member 1002 are connected to each other with two pins 1003 linearly placed at two parts, an upper side and a lower side of the film fixing member 1000 in FIG. 1A, and the connected parts form hinge structures. The film fixing member 1000 can be opened and folded by rotating the opening and folding member 1001 with two pins 1003 as rotary axes. Note that, FIGS. 1A and 1B show the opened film fixing member 1000. In the film fixing member 1000, a recessed part 1004 is formed on a surface of the side where the film 11 is fixed. The recessed part 1004 continues through the opening and folding member 1001 in the left side and the fixed side member 1002 in the right side. The recessed part 1004 is shaped in a circle so as to correspond to a shape of the resin molded product (package). An outer edge 1004*a* of the recessed part 1004 is shaped in a circle smaller than the film 11. This recessed part 1004 is formed such that the liquid resin with a set thickness (target thickness) or the same thickness as the package can be held within the recessed part 1004 when the film fixing member 1000 is folded. Note that, the set thickness (target thickness) herein is a thickness aimed to be a thickness of the package. Around the outer edge 1004*a* of the recessed part 1004, a plurality of suction holes (suction parts) 1005 are provided so as to entirely surround the recessed part 1004. The plurality of suction holes 1005 penetrate the film fixing member 1000 from the side for fixing the film 11 to the opposite side. A periphery of the film 11 can be sucked by a suction mechanism (not shown, a vacuum pump for example) through the suction holes 1005, and thus can be sucked to the film fixing member 1000. This suction enables the film 11 to be fixed to the film fixing member 1000. The liquid resin 21 is supplied on a part of a surface of the film 11 on the side to be applied with the liquid resin 21, in other words, the side opposite to the side fixed to the film fixing member 1000. The liquid resin 21 is supplied on the central part of the film 11.

Figure 2:
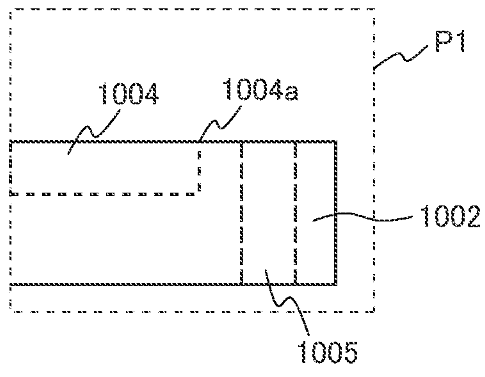
FIG. 2 is a partial enlarged view of FIG. 1B.

FIG. 2 is an enlarged view of a part of FIG. 1B surrounded by a dushed line P1 (end part of the fixed side member 1002). As described above, the recessed part 1004 is formed on the fixed side member 1002, and the suction holes 1005 are provided around the outer edge 1004*a* of the recessed part 1004. The opening and folding member 1001 has the same structure, not shown in FIG. 2.

The film 11 is not particularly limited and may be, for example, the release film as described above. Although the film 11 is shaped in a circle in FIGS. 1A and 1B, a shape of the film 11 is not limited thereto and may be any shape as described below. A size of the film 11 is not limited either and may be freely determined. When using the film 11 and the liquid resin 21 in producing a resin molded product for example, a shape and a size of the film 11 may be appropriately determined depending on a resin molded product aimed to be produced.

The liquid resin 21 is not particularly limited either and may be, for example, the flowable resin having flowability at a normal temperature (room temperature) or the molten resin as described above. The liquid resin 21 may also be a thermosetting resin, for example. When using the film 11 and the liquid resin 21 in producing a resin molded product for example, the liquid resin 21 may be the same as or based on a liquid resin used in a common method for producing a resin molded product. The liquid resin 21 is preferred to have viscosity high enough to prevent the liquid resin 21 from falling from the upper side to the lower side of the film when folding the film 11 as described below.

Next, an example of the method for producing a resin molded product using the film fixing member 1000 of FIGS. 1A and 1B will be described.

Firstly, as shown in FIGS. 1A and 1B, the liquid resin 21 is supplied on a part of the surface of the film 11 to be applied with the liquid resin (central part of the film 11 in FIGS. 1A and 1B) (supplying the liquid resin). A method for supplying the liquid resin 21 is not particularly limited and may be, for example, ejecting the liquid resin 21 on the film 11 using an ejecting mechanism as described below.

The film fixing member 1000 in the state of FIGS. 1A and 1B is then folded so as to fold the film 11 supplied with the liquid resin 21, such that the side supplied with the liquid resin 21 be inside, thereby spreading the liquid resin 21 over the surface folded inward (spreading the liquid resin).

Figure 3:
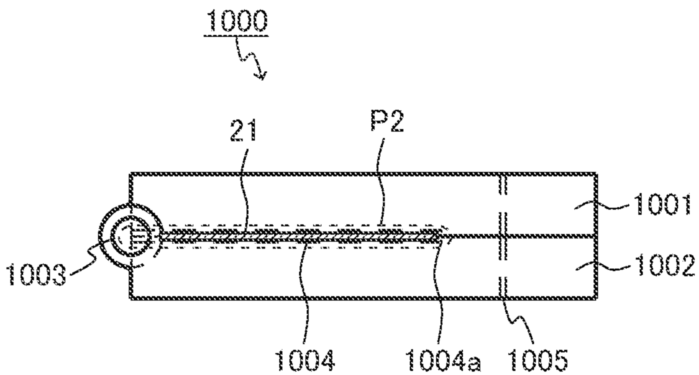
FIG. 3 is a side view showing the film fixing member of FIGS. 1A and 1B after being folded.

FIG. 3 shows the film fixing member 1000 folded from the state of FIGS. 1A and 1B. As shown in the area in FIG. 3 surrounded by a dushed line P2, the liquid resin 21 is almost entirely spread in the recessed part 1004 in this state. Herein, a thickness of the liquid resin 21 in this state is defined as 2 T, which is a doubled thickness of the target thickness T after opening the film, for example.

Figure 4A:
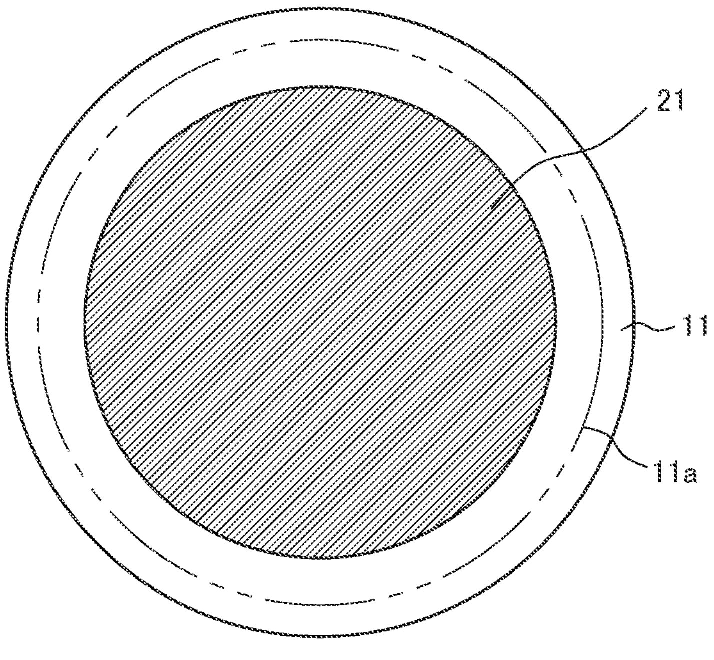
FIGS. 4A and 4B exemplify a part of the opening the film in the method of producing a resin molded product of the present invention.
Figure 4B:
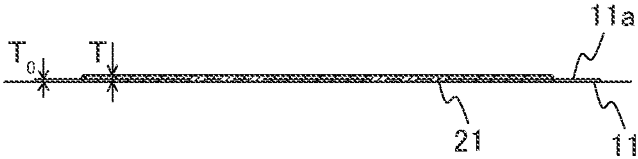

The folded film fixing member 1000 is then opened, thereby opening the film 11 folded in the spreading the liquid resin of FIG. 3 (opening the film). FIGS. 4A and 4B show the film fixing member 1000 and the film 11 which are completely opened. Note that, the film fixing member 1000 is not shown in FIGS. 4A and 4B for convenience and simplification in illustrating. FIG. 4A is a plan view (top view) and FIG. 4B is a side view viewed from the lower direction on the paper surface in FIG. 4A. Through this opening the film, as shown in FIG. 4B, a thickness of the liquid resin 21 becomes the target thickness T after the opening the film. In FIGS. 4A and 4B, 11*a* is a liquid resin applying area to be applied with the liquid resin 21 in the film 11. Specifically, inside a circle shown by a dotted line in FIG. 1A is the liquid resin applying area 11*a*. In a state shown in FIGS. 4A and 4B, the liquid resin 21 is not spread to an outer edge of the liquid resin applying area 11*a*. As the liquid resin 21 is spread to the outer edge of the liquid resin applying area 11*a* as described below, the thickness of the liquid resin 21 becomes the ultimate target thickness $T_0$. $T_0$ is equal to a resin thickness (package thickness) of a resin molded product aimed to be produced, for example. $T_0$ is a thickness smaller than T.

From the state of FIGS. 4A and 4B, the film 11 and the liquid resin 21 are conveyed to a molding die 531 described below (see FIG. 7) and heated, for example. By the heating, viscosity of the liquid resin 21 lowers and the liquid resin 21 spreads, thereby achieving the target thickness $T_0$ of the liquid resin 21.

As described above with reference to FIGS. 1A and 1B to FIG. 4, the spreading the liquid resin 21 in the method for producing a resin molded product of the present example can be performed. Further, performing resin molding of the liquid resin 21 applied on the film 11 can complete the method for producing a resin molded product of the present example, and thus can produce a resin molded product. A method of the performing resin molding is not particularly limited and may be the same as or based on a common resin molding method. A resin molding method is not particularly limited either and may be, for example, compression molding as described above. The method of the performing resin molding may be as described below in Example 2, for example.

As described above, in the conventional method for producing a resin molded product without using a spreading member for spreading a liquid resin, applying the liquid resin needs a long time in a case where an area to be applied with the liquid resin is large. For example, ejecting the liquid resin at one point of the center on the film can save time for ejection of the liquid resin. However, in this case, distance of the liquid resin 21 flowing and spreading to the outer edge of the liquid resin applying area is long. Thus, spreading the liquid resin needs a long time. Therefore, non-filling of a resin or a flow mark may arise in the produced resin molded product. Further, as described above, after conveying the liquid resin to the molding die, the liquid resin may harden before reaching the end of the area to be applied with the liquid resin, for example. In contrast, ejecting the liquid resin in a thin spiral shape almost entirely on the liquid resin applying area needs a shorter time for the liquid resin to flow and spread to the outer edge of the liquid resin applying area than the one-point ejection, for example. However, ejection of the liquid resin needs a long time instead.

On the other hand, the method for producing a resin molded product of the present invention achieves, as described above with reference to FIGS. 1A and 1B to FIG. 4, spreading a resin without using a spreading member, and applying a liquid resin in a short time even when an area to be applied with the liquid resin is large. This method can handle, for example, a large and thin resin molded product (also referred to as a package or PKG) aimed to be produced.

In the method for producing a resin molded product of the present invention, a form and a shape of the liquid resin supplied on the film before being spread is not particularly limited and may be freely determined and may be, for example, the one point or the spiral shape as shown in FIGS. 1A and 1B, or any other forms and shapes. However, the one-point ejection on the central part of the film is preferable so that the ejection can be easily carried out in a short time, for example. A shape and a form of the liquid resin before being spread are not limited to the one point and may be freely determined as described above and may be, for example, two points, three points, and the like.

The method for producing a resin molded product of the present invention can provide effects as described below for example.

(1) A liquid resin can be applied on a film thinly in a large area.

(2) Using such a liquid resin applied thinly in a large area in producing a resin molded product can improve molding quality.

(3) One-point ejection is sufficient for the ejection of the liquid resin before folding a film, and thus a nozzle for the liquid resin ejection can be designed to be thick. Such a design with the thick nozzle can shorten a time for ejecting the liquid resin.

(4) As no use of a spreading member is needed, the liquid resin does not adhere to the spreading member, and thus loss of a resin can be prevented. In addition, there is no need for a member or a process for cleaning the spreading member.

Figure 5A:
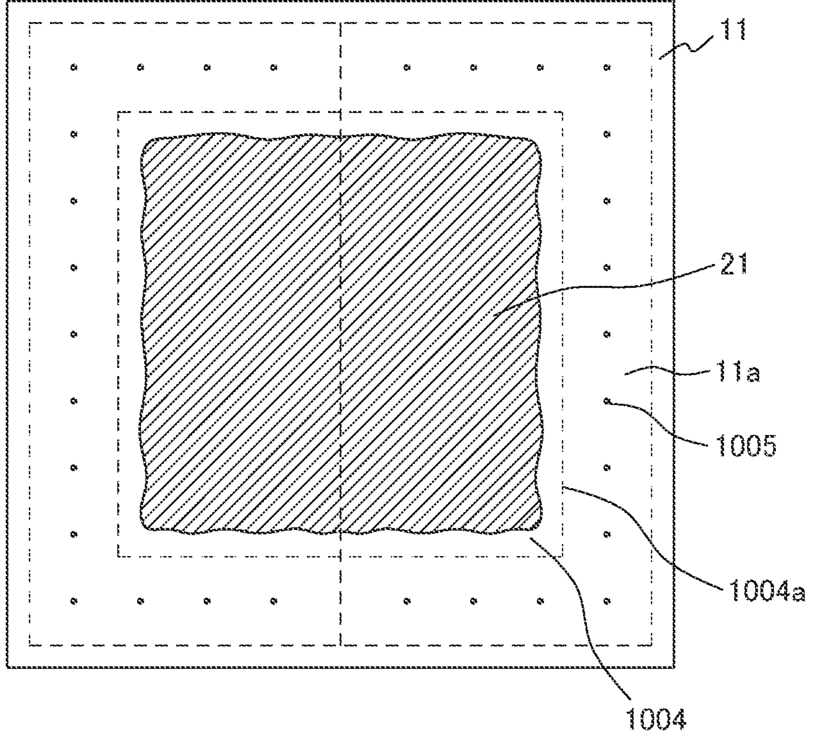
FIGS. 5A and 5B show a square film after performing the spreading the liquid resin and the opening a film.
Figure 5B:
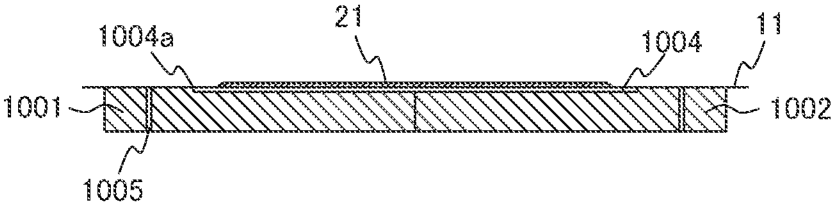

FIGS. 1A and 1B to FIGS. 4A and 4B showed an example using the film 11 shaped in a circle (wafer-like). However, a shape of the film 11 is not limited to a circle and may be any shape. FIGS. 5A and 5B show an example using the film 11 shaped in a square (panel-like). FIGS. 5A and 5B are states after the opening the film, similarly to the states of FIGS. 4A and 4B. Each of the film 11, the liquid resin applying area 11*a* and the recessed part 1004 (outer edge 1004*a* of the recessed part 1004) of the film fixing member 1000 in FIGS. 5A and 5B is the same as in FIGS. 1A and 1B to FIGS. 4A and 4B except for each being square. The method for producing a resin molded product using these can be performed in the same way as in FIGS. 1A and 1B to FIGS. 4A and 4B. A shape of the film 11 is not limited to a circle or a square, and may be any shape. The shape of the film 11 is preferred to be symmetric as the film 11 is folded in half, and may be a rectangular or the like, for example.

The present example described an example of fixing the film 11 to the film fixing member 1000 by suction. However, in the present invention, a method for fixing the film to the film fixing member is not limited to the suction, and may be mechanical clamp or the like for example.

Example 2

Next, another example of the present invention will be described below. The present example describes an example of the resin molding apparatus of the present invention and the method for producing a resin molded product of the present invention using the resin molding apparatus.

1. Resin Molding Apparatus

An example of the resin molding apparatus of the present invention will be described below.

(1) Ejecting Mechanism (Liquid Resin Supply Mechanism)

Figure 6:
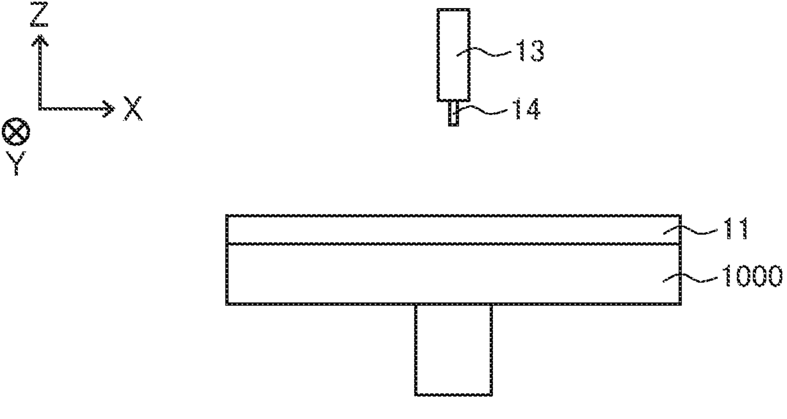
FIG. 6 is a side view schematically showing an example of an ejecting mechanism (liquid resin supply mechanism) of the resin molding apparatus of the present invention.

A side view of FIG. 6 schematically shows an example of the ejecting mechanism (liquid resin supply mechanism) in the resin molding apparatus of the present invention. As shown in FIG. 6, this ejecting mechanism includes a film fixing member 1000 and a dispenser 13. The film fixing member 1000 is the same as the film fixing member 1000 of FIGS. 1A and 1B to FIG. 3 in example 1. Note that, instead of this film fixing member 1000, the film fixing member 1000 of FIGS. 5A and 5B in example 1 or any other film fixing members may be used. The film fixing member 1000 has a release film 11 mounted and fixed on an upper surface thereof. The release film 11 is the same as the film 11 in example 1. The release film 11 may be a film made of resin, for example. The release film 11 corresponds to an "applying object" in which the liquid resin for resin molding is applied on the applying area on the upper surface. The release film 11 prevents a cured resin (sealing resin), that is a liquid resin after being cured, from adhering to the molding die after resin molding, and thus facilitates removing a resin molded product. The film fixing member 1000 may be movable or rotatable in a biaxial direction of X-Y (substantially horizontal direction) or may be movable in a triaxial direction of X-Y-Z (i.e., in any direction at least including a horizontal component or a vertical component). As described above, the release film 11 may be fixed to the upper surface of the film fixing member 1000 by suction, by sucking the release film 11 through the suction holes 1005 (not shown in FIG. 6) on the upper surface of the film fixing member 1000 with a suction mechanism (not shown, a vacuum pump for example), for example. The dispenser 13 is a mechanism configured to eject the liquid resin on the release film 11 and corresponds to the "ejecting mechanism". The dispenser 13 is equipped with a nozzle 14 and the liquid resin can be ejected on the release film from a tip outlet of the nozzle 14. The dispenser 13 is movable in the biaxial direction of X-Y (substantially a horizontal direction) together with the nozzle 14. This enables an ejection position of the liquid resin to be moved. In addition to or instead of this, the ejection position of the liquid resin may be moved by moving the film fixing member 1000 in the biaxial direction of X-Y (substantially horizontal direction). The ejecting mechanism of FIG. 6 may further include the liquid resin spreading mechanism of the present invention to spread the liquid resin ejected on the release film 11. The liquid resin spreading mechanism may be, for example, configured to fold the release film 11 supplied with the liquid resin and open the folded release film 11. The liquid resin spreading mechanism may be, for example, configured to fold the film fixing member 1000 fixing the release film 11 supplied with the liquid resin thereon and open the folded film fixing member 1000.

(2) Resin Molding Mechanism

Figure 7:
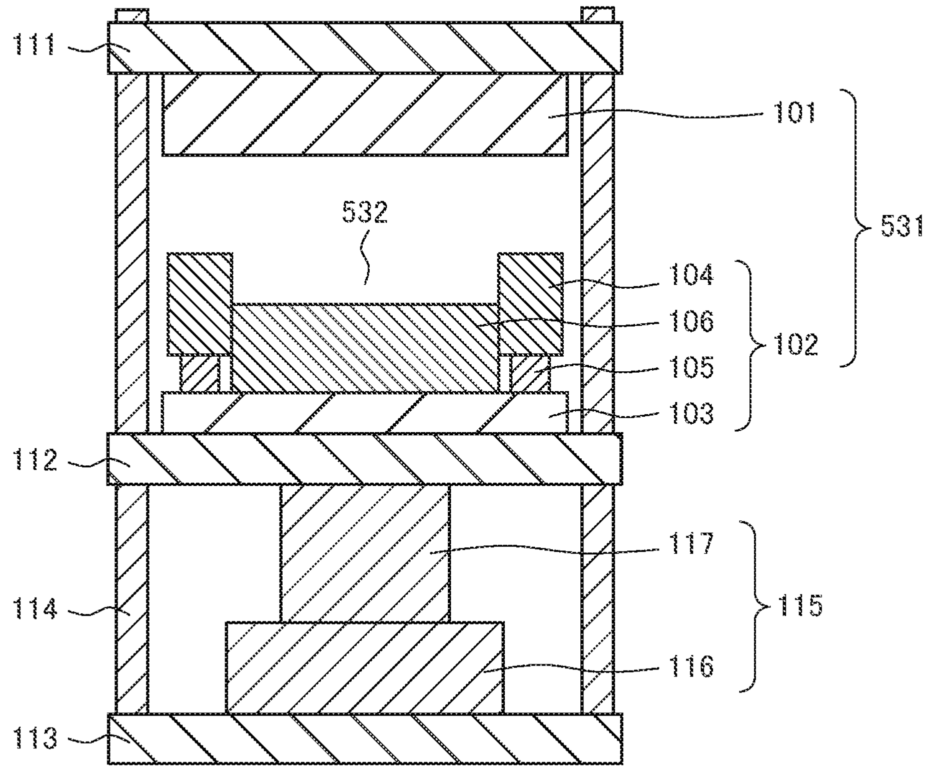
FIG. 7 is a side view schematically showing an example of a compression molding mechanism (resin molding mechanism) of the resin molding apparatus of the present invention.

A cross-sectional view of FIG. 7 schematically shows an example of a resin molding mechanism in the resin molding apparatus of the present invention. The resin molding mechanism of FIG. 7 is a compression molding mechanism configured to perform resin molding by compression molding. As shown in FIG. 7, this resin molding mechanism includes a molding die 531 and a mold clamping mechanism 115. The molding die 531 consists of an upper die 101 and a lower die 102. An upper end of the upper die 101 is fixed to a fixed platen 111, and the upper die 101 is suspended from a lower surface of the fixed platen 111. The lower die 102 is mounted on a movable platen 112. The movable platen 112 is ascendable and descendible in a vertical direction, as described below.

As shown in FIG. 7, the lower die 102 includes a lower die base member 103, lower die cavity side walls 104, elastic members 105, and a lower die cavity bottom surface member 106. The lower die base member 103 is mounted on an upper surface of the movable platen 112. The lower die cavity bottom surface member 106 is attached to an upper surface of the lower die base member 103 and forms a bottom surface of a lower die cavity 532. The lower die cavity side wall 104 is a flame-like member placed so as to surround the lower die cavity surface member 106, attached to the upper surface of the lower die base member 103 via the elastic member 105, and configures a side of the lower die cavity 532. In the lower die 102, the lower die cavity 532 is configured with the lower die cavity bottom surface member 106 and the lower die cavity side walls 104. The lower die 102 also includes a heating mechanism (not shown) configured to heat the lower die 102, for example. Heating of the lower die 102 by the heating mechanism achieves heating and curing the resin inside the lower die cavity 532, for example.

The molding clamping mechanism 115 is configured to clamp and open the molding die. As shown in FIG. 7, the molding die clamping mechanism 115 includes a drive source 116, and a transmission member 117 configured to transmit drive power from the drive source 116. A lower surface (lower end) of the movable platen 112 is connected to the drive source 116 via the transmission member 117. The drive source 116 is placed on a base 113. By ascending and descending the movable platen 112 with the drive source 116, the lower die 102 placed thereon can be ascended and descended. In other words, the mold clamping mechanism 115 is configured to clamp the molding die by driving the movable platen 112 upward, and open the molding die by driving the movable platen 112 downward. The driving source 116 is not particularly limited, and for example, an electric motor such as a servomotor can be used. The transmission member 117 is not particularly limited either, and for example, can be configured using a ball screw. Also, for example, a hydraulic cylinder can be used as the driving source 116, and a rod can be used as the transmission member 117 to configure the mold clamping mechanism 115. A toggle link mechanism can also be used to configure the mold clamping mechanism 115.

At each of four corners of the base 113, the movable platen 112 and the fixed platen 111, a tie-bar (columnar member) 114 is provided as a holding member. Specifically, upper ends of the four tie-bars are fixed to four corners of the fixed platen 111, and lower ends are fixed to four corners of the base 113. Each of the tie-bars 114 penetrates a hole drilled through each of the four corners of the movable platen 112. The movable platen 112 can be ascended and descended along the tie-bars 114. Instead of the tie-bar (columnar member), for example, a wall-like member such as a hold frame (a registered trademark) may be used as the tie-bar (holding member) 114. The wall-like member may be provided between surfaces of the movable platen 112 and the fixed platen 111 facing each other, for example.

Although FIG. 7 shows a structure in which the lower die cavity bottom surface member 106 is ascended and descended using the mold clamping mechanism 115, the present invention is not limited thereto. In addition to the mold clamping mechanism 115, another driving mechanism configured to ascend and descend the lower die cavity bottom surface member 106 may be provided for example, and this structure needs no use of the elastic member 105.

(3) Entire Structure of Resin Molding Apparatus

Figure 8:
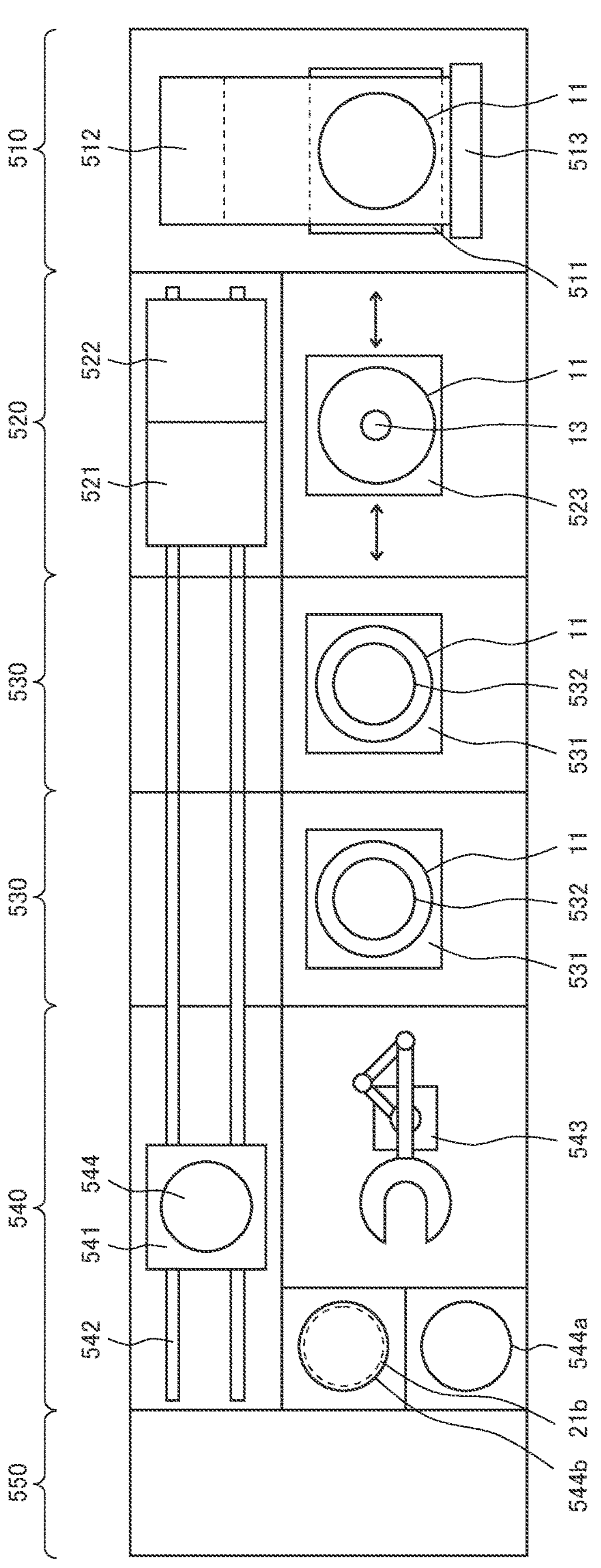
FIG. 8 is a plan view schematically showing another example of the resin molding apparatus of the present invention.

Next, a plan view of FIG. 8 schematically shows an example of a structure of the resin molding apparatus of the present invention. The resin molding apparatus of FIG. 8 is for producing an electric component (resin molded product). As shown in FIG. 8, in this apparatus, a release film cutting module (release film cutting mechanism) 510, an ejecting mechanism (applying module) 520, a compression molding mechanism (compression molding module) 530, a conveying mechanism (conveyer module) 540 and a controller 550 are placed in this order from the right side of the illustrated apparatus. The compression molding mechanism 530 is a resin molding mechanism configured to perform resin molding by compression molding and the same as the compression molding mechanism (resin molding mechanism) described in FIG. 7. Each of these modules is configured separately and mutually detachable to the adjacent module. The applying module 520 includes the ejecting mechanism configured to eject the liquid resin for resin molding to the applying area on the release film (applying object) as described below. The applying module 520 includes the ejecting mechanism (ejecting module) configured to eject the liquid resin and a liquid resin spreading mechanism (resin spreading module) configured to spread the liquid resin, as described below.

The release film cutting module (release film cutting mechanism) 510 is configured to cut out a round-shaped release film from a long release film. As shown in FIG. 8, the release film cutting module 510 includes a film fixing member mounting mechanism 511, a rolled release film 512 and a film gripper 513. The film fixing member 1000 of FIG. 6 (not shown in FIG. 8) is mounted on an upper surface of the film fixing member mounting mechanism 511. The film fixing member 1000 may be called a “film fixation base”, as functioning as a fixation base to fix the film 11 as described above. This resin molding apparatus may further include a film fixing member fixation base configured to fix the film fixing member 1000, for example. As shown in FIG. 8, the end of the release film is pulled out from the rolled release film 512, and set so as to cover an upper surface of the film fixing member 1000 mounted on the film fixing member mounting mechanism 511, thereby the release film can be fixed on the film fixing member 1000. The film gripper 513 can pull out the release film from the rolled release film 512, while fixing the end of the release film to a side of the film fixing member mounting mechanism 511 opposite to the rolled release film 512. On the film fixing member mounting mechanism 511, the release film can be cut by a cutter (not shown), thereby forming the round-shaped release film 11. The release film cutting module 510 further includes a waste disposal mechanism (not shown) configured to dispose a remaining release film (waste) after cutting out the round-shaped release film 11.

The applying module 520 includes the ejecting mechanism and a resin loader (resin conveying mechanism) 521 and an aftertreatment mechanism 522. As described in FIG. 6, the ejecting mechanism includes the release film 11, a table (fixation base) 12 and a dispenser 13 (ejecting mechanism) equipped with a nozzle 14. Note that, the film fixing member 1000 is not shown in FIG. 8 because of being invisible behind the release film 11 in the plan view (seen from above). The nozzle 14 is not shown in FIG. 8 either because of being invisible behind the dispenser 13. In FIG. 8, the ejecting mechanism further includes a film fixing member moving mechanism 523. The film fixing member 1000 and the release film 11 are mounted on the film fixing member moving mechanism 523. Movement in a horizontal direction or rotation of the film fixing member moving mechanism 523 achieves movement or rotation of the film fixing member 1000 mounted thereon together with the release film 11. In FIG. 8, the film fixing member moving mechanism 523 is the same as the above-described film fixing member mounting mechanism 511 and configured to move between the release film cutting module 510 and the applying module 520. The applying module 520 further includes a liquid resin spreading mechanism (not shown) configured to spread the liquid resin ejected on the release film 11. The liquid resin spreading mechanism may be, for example, configured to fold the release film 11 supplied with the liquid resin and open the folded release film 11. The liquid resin spreading mechanism may also be, for example, configured to fold the film fixing member 1000 fixing the release film supplied with the liquid resin thereon and open the folded film fixing member 1000. The liquid resin spreading mechanism may be, for example, a part of the ejecting mechanism as described above. The film fixing member moving mechanism 523 may include the liquid resin spreading mechanism, for example. The liquid resin spreading mechanism may be configured to be folded and opened with power (not shown), and to fold and open the release film 11 alone or together with the film fixing member 1000. The folding and the opening of the liquid resin spreading mechanism may be controlled by the controller 550, for example. The applying module 520 may include a camera (sensor), a heater, and the like as described below. The resin loader 521 and the aftertreatment mechanism 522 are integrally structured. The resin loader 521 can engage a frame (round-shaped frame) and the release film 11 with each other in a state where the liquid resin 21 (not shown in FIG. 8) is supplied on the release film 11 (in a resin storage) suction-fixed to the lower end surface of the frame (round-shaped frame). In this state, the liquid resin then can be set for supply in a lower die cavity for compression molding in the compression molding module 530 described below, in a state where being applied to the release film 11.

As shown in FIG. 8, the compression molding module 530 includes a molding die 531. The molding die 531 is not particularly limited and may be, for example, a metal die. The molding die 531 includes an upper die and a lower die (not shown) as main components, and a lower die cavity 532 is shaped in a circle as shown in FIG. 8. The molding die 531 is provided with an upper die substrate setter (not shown) and a lower die cavity bottom surface member (not shown) for pressurizing the resin. In the compression molding module 530, a chip (semiconductor chip, for example) attached to a substrate before resin sealing (substrate before molding) described below is resin-sealed into a sealing resin (resin package) in the lower die cavity to form a resin-sealed substrate (molded substrate). The compression molding module 530 may include the compression molding mechanism shown in FIG. 7, and the molding die 531 may be the molding die 531 shown in FIG. 7, for example.

The conveying mechanism (conveying module) 540 is configured to convey the chip before resin sealing (resin sealing object) together with the substrate, and to convey a resin-sealed electronic component (resin molded product). As shown in FIG. 8, the conveying mechanism (conveying module) 540 includes a substrate loader 541, a rail 542, and a robot arm 543. The rail 542 protrudes from the conveying mechanism (conveying module) 540 and reaches areas of the compression molding module 530 and the applying module 520. A substrate 544 can be mounted on the substrate loader 541. The substrate 544 may be a substrate before resin sealing (substrate before molding) 544*a* or a resin-sealed substrate (molded substrate) 544*b*. The substrate loader 541 and a resin loader 521 (aftertreatment mechanism 522) are configured to move on the rail 542, through the applying module 520, the compression molding module 530, and the conveying module 540. As shown in FIG. 8, the conveying module 540 includes a substrate storage and configured to store the substrate before resin sealing (substrate before molding) 544*a* and the resin-sealed substrate (molded substrate) 544*b* individually. A chip (for example a semiconductor chip, not shown) is attached to the substrate before molding 544*a*. In the molded substrate 544*b*, the chip is sealed with a resin (sealing resin) made of a solidified liquid resin, thereby the electronic component (resin molded product) is formed. The robot arm 543 can be used as follows, for example. Firstly, by using the robot arm 543, the substrate before molding 544*a* is taken out from the storage for the substrate before molding 544*a* and turned upside down, thereby the substrate before molding 544*a* can be mounted on the substrate loader 541 such that the face equipped with the chip faces downward. Secondarily, the molded substrate 544*b* is taken out from the substrate loader 541 and turned upside down, thereby the molded substrate 544*b* can be stored in the storage for the molded substrate such that the resin-sealed side faces upward.

The controller 550 controls cutting the release film, ejecting the liquid resin, spreading the liquid resin, conveying the substrate before sealing and the sealed substrate, conveying the resin material, conveying the release film, heating the molding die, clamping and opening the molding die, and the like. In other words, the controller 550 controls each of the operations in the release film cutting module 510, the applying module 520, the molding module 530 and the conveying module 540. In this way, the resin molding apparatus of the present invention may operate as a fully automatic apparatus with each of the components being controlled by the controller. The resin molding apparatus of the present invention may also operate as a manual apparatus without the use of the controller. However, the control of each of the components by the controller achieves efficiency. The controller 550 includes a calculator and a memory (not shown).

A position where the controller 550 is placed is not limited to the position shown in FIG. 8 and may be freely set. For example, the controller 550 can be placed in at least one of the modules 510, 520, 530 or 540, or can be placed at the outside of each of the modules. The controller 550 can be configured as a plurality of controllers by separating at least a part of the controller 550, depending on the operation to be controlled.

The resin molding apparatus of FIG. 8 includes two compression molding modules 530 placed between the applying module 520 and the conveying module 540 to be adjacent to each other. In the resin molding apparatus of FIG. 8, the conveying module 540 and the adjacent molding module 530, or the applying module 520 and the adjacent molding module 530, or both of these combinations are mutually detachable. Further, the two molding modules 530 are mutually detachable. However, the number of the molding modules 530 is not limited to two, and may be one or three or more. For example, three or more compression molding modules 530 may be placed between the applying module 520 and the conveying module 540 to be adjacent to one another.

In the resin molding apparatus of FIG. 8, the conveying module 540 configured to supply the substrate and the applying module 520 configured to eject the liquid resin on the release film are placed to be opposite to each other with the compression molding module 530 in between, as described above. The release film cutting module 510 configured to form the round-shaped release film is placed at the outside of the applying module 520. This resin molding apparatus is a separable resin molding apparatus with each of the modules being separately placed. A position of each of the modules of the resin molding apparatus of the present invention is not particularly limited and may be different from the position shown in FIG. 8. For example, the appropriate number of the compression molding modules can be placed to be detachable. Also, the release film cutting module (round-shaped release film forming module), the applying module and the conveying module (substrate module) can be collectively placed at either side next to the compression molding module. In this case, the release film module, the applying module and the substrate module are parent modules, and the compression molding module is a child module (parent-child type). In this case, the appropriate number of the compression molding modules can be placed side by side. The release film cutting module, the applying module and the conveying module (substrate module) may be integrated with each other. The release film cutting module, the applying module, the conveying module (substrate module) and one molding module may be integrated with each other, and the entire part consisting of these integrated components operates as a single resin molding apparatus (compression molding apparatus, for example).

When placing two or more compression molding modules between the conveying module (substrate module) and the applying module, and when placing two or more compression molding modules side by side so as to follow the parent modules, the compression molding modules are preferred to be placed as follows. The molding modules are each placed side by side along the rail for transferring the components including the substrate loader, the resin loader and the aftertreatment mechanism. Each of the modules of the resin molding apparatus of the present invention can be made to be mutually detachable by utilizing a connector such as a bolt, a nut or the like, or an appropriate positioning mechanism, for example. Also, the compression molding modules can be structured to be detachable to each other. This achieves increasing or decreasing the number of the compression molding modules later.

2. Method for Producing Resin Molded Product

An example of the method for producing a resin molded product of the present invention will be described below. The example described below is specifically an example of the method for producing a resin molded product using the resin molding apparatus described in FIG. 8.

(1) Applying Liquid Resin

An example of the applying a liquid resin (method for producing a resin molded product) for applying a liquid resin for resin molding on an applying area of a film which is an applying object.

(1-1) Ejecting (Supplying Liquid Resin)

Ejecting and supplying a liquid resin for resin molding (supplying a liquid resin), to an applying area of the release film 11 which is an applying object, is performed using the ejecting mechanism of FIG. 6. The liquid resin is ejected from the tip outlet of the nozzle 14 of FIG. 6 to at least a part inside the applying area on the film 11, thereby supplying the liquid resin. The applying area on the release film 11 will be described below. In this ejecting, for example, an ejection position of the liquid resin may be moved by moving the dispenser 13 with the nozzle 14 in a biaxial direction of X-Y (substantially horizontal direction). In addition to or instead of this, the ejection position of the liquid resin may be moved by moving the film fixing member 1000 in the biaxial direction of X-Y (substantially horizontal direction). For example, the release film 11 (applying object) may be vibrated together with the film fixing member 1000 while the ejection of the liquid resin from the nozzle 14. In addition to or instead of this, the nozzle 14 may be vibrated. However, the method for producing a resin molded product of the present invention can achieve applying the liquid resin in a short time as described above, without moving or vibrating the nozzle 14.

Note that, the liquid resin is not particularly limited, and may be a liquid resin being liquid at a normal temperature (room temperature) or a molten resin, as described above. Definitions of the "liquid resin" and the "molten resin" are as described above. The liquid resin is preferred to be the liquid resin being liquid at a normal temperature (room temperature) from a viewpoint of easiness of handling or the like. The liquid resin may also be a thermosetting resin, for example. The thermosetting resin is a liquid resin at a normal temperature, changes its viscosity to a lower degree upon heating, polymerizes and be cured upon further heating, and becomes a cured resin, for example. In the present invention, the liquid resin is preferred to be a thermosetting resin having relatively high viscosity with such degree that the resin does not flow at a normal temperature immediately after being ejected, for example.

Before the ejecting, for example, weighing the liquid resin may be performed using a liquid resin weighing mechanism. Thereby, an appropriate amount of the liquid resin without excess or shortage may be ejected on the release film 11. The liquid resin weighing mechanism is not particularly limited, and for example, a weighing mechanism used for a granular resin (a load cell for weighing, for example) described in JP-A-2003-165133 or the like may be used. The liquid resin weighing mechanism may be placed at the side or the like of the dispenser 13 to be adjacent thereto, for example.

(1-2) Spreading Liquid Resin

Spreading a liquid resin ejected on the release film 11 is performed. This spreading the liquid resin is not particularly limited and may be performed by the method described in example 1, for example. This spreading the liquid resin may be performed using a liquid resin spreading mechanism (not shown) provided in the applying module 520, for example. This liquid resin spreading mechanism is as described above.

Thereby, the applying the liquid resin for resin molding to the applying area on the film (applying object) 11 can be performed.

Note that, a size of the film (release film or the like), which is the applying object, is not particularly limited as described above. However, the present invention achieves applying the liquid resin in a short time even when the area to be applied with the liquid resin is large, and thus is adequate for a large film. For example, a diameter of the applying area on the film, which is the applying object, may be 300 mm or more, or the like.

(2) Performing Resin Molding

Performing resin molding in the method for producing a resin molded product of the present invention is done using the resin molding mechanism shown in FIG. 7. The resin molding mechanism shown in FIG. 7 is a compression molding mechanism configured to perform resin molding by compression molding, as described above. Thus, the performing resin molding using this resin molding mechanism is performing compression molding in which the resin molding is performed by compression molding. The performing compression molding is not particularly limited and may be done in the same way as or based on common compression molding, or by a method described below, for example. A method for operating the resin molding mechanism shown in FIG. 7 in the performing compression molding may be in accordance with the above description of FIG. 7 or as described below, for example.

The above is an example of the performing resin molding and the conveying. However, the performing resin molding and the conveying are not particularly limited and may be done based on a common resin sealing method, for example.

(3) Method for Producing Resin Molded Product

An example of the entire process of the method for producing a resin molded product using the resin molding apparatus of FIG. 8 will be described below.

Firstly, in the release film cutting module (release film cutting mechanism) 510, the film gripper 513 pulls out the end of the release film from the rolled release film 512, and covers the upper surface of the film fixing member 1000 mounted on the film fixing member mounting mechanism 511 with the release film pulled out and fixes the release film on the film fixing member 1000, as described above. In this state, the cutter (not shown) cuts the release film to form the round-shaped release film 11, as described above. The remaining release film (waste) after cutting out the round-shaped release film is disposed by the waste disposal mechanism (not shown).

The film fixing member mounting mechanism 511 (film fixing member moving mechanism 523) is transferred together with the film fixing member 1000 (not shown) and the release film 11 mounted on the film fixing member mounting mechanism 511, and set underneath the resin supply port of the nozzle 14 in the applying module 520. In this state, for example, the liquid resin 21 is ejected (the ejecting) and spread (the spreading the liquid resin) within the applying area on the release film 11. Thereby, the liquid resin is applied on the release film (the applying the liquid resin). The ejecting and the spreading the liquid resin can be performed as described above, for example.

The release film 11 and the liquid resin applied to the applying area on the release film 11 are then transferred from the film fixing member moving mechanism 523 and retained by the resin loader (resin conveying mechanism) 521. The release film 11 can be transferred from the film fixing member moving mechanism 523 to the resin loader 521 by being retained by the retaining mechanism (not shown) of the resin loader 521.

Then, the robot arm 543 takes out the substrate before molding 544*a* from the storage for the substrate before molding 544*a*, and turns the substrate before molding 544*a* upside down, as described above. Thereby the substrate before molding 544*a* is mounted on the substrate loader 541 such that the face equipped with the chip faces downward, and conveyed into the resin molding module 530. At this time, the substrate before molding 544*a* is set to the die surface of the upper die (molding die 531) for supply. Then, as described in FIG. 27 in FIG. 8, the resin loader 521 retaining the release film 11 and the liquid resin is transferred on the rail 542, together with the aftertreatment mechanism 522 integrated with the resin loader 521 and conveyed into the resin molding module 530 (conveying mechanism). At this time, as described in FIG. 28 in FIG. 8, the release film 11 is mounted on a die surface of the lower die, thereby supplying the release film 11 and the liquid resin into the lower die cavity 532 having a round-shaped opening.

The liquid resin applied to the applying area on the release film 11 is subjected to resin molding in the resin molding module 530 and the molding die 531 (the performing resin molding). Firstly, in the resin molding module 530, the molding die 531 (the upper die and the lower die) is clamped. Thereby, the chip attached to the substrate before molding 544*a* set to the upper die is immersed in the liquid resin in the lower die cavity 532, and the liquid resin in the lower die cavity 532 can be pressed by a cavity bottom surface member. In the molding die 531 (lower die cavity 532), the liquid resin is solidified (cured by heating, for example), and the solidified resin (sealing resin) 21*b* is used to seal (resin molding) the electronic component. The performing resin molding is done in this way, thereby the resin-sealed substrate 544*b* (molded substrate, electronic component) is formed. The molding die 531 (the upper die and the lower die) is then opened. The resin-sealed substrate 544*b* is taken out and conveyed to the conveying module 540 by the substrate loader 541 to be stored. After taking out the resin-sealed substrate (molded substrate, electronic component) 544*b* from the molding die 531 by the substrate loader 541, the substrate setter of the upper die is cleaned using an upper die surface cleaner (not shown) of the aftertreatment mechanism 522. In parallel to this or at a different timing, the release film which is no longer needed can be taken out from the lower die surface, using a release film removing mechanism (not shown) of the aftertreatment mechanism.

Otherwise, the substrate loader 541 having the resin-sealed substrate 544*b* (electronic component) mounted thereon may be transferred from inside the resin molding module 530 into the conveying module 540. In this case, by using the robot arm 543, the resin-sealed substrate (molded substrate, electronic component) 544*b* is taken out from the substrate loader 541 and turned upside down, as described above. Thereby the resin-sealed substrate (molded substrate, electronic component) 544*b* is stored in the storage for the resin-sealed substrate (molded substrate, electronic component) 544*b* such that the resin-sealed side faces upward. In this way, the electronic component (resin molded article) can be produced.

The electronic component producing apparatus and the method for producing the electronic component using the apparatus was described with reference to FIG. 8. However, the present invention is not limited to the electronic component, and may be applied to productions of any other resin molded products. The present invention can be applied for producing, for example, a lens, an optical module, an optical component such as a light guide plate or the like or other resin molded products using compression molding.

The present invention is not limited to the above-described embodiments. Various combination, changes, and selections may be made freely and appropriately in the configuration and specifics of the present invention without departing from the scope of the present invention.

This application claims priority from Japanese Patent Application No. 2021-155803 filed on Sep. 24, 2021. The entire subject matter of the Japanese Patent Application is incorporated herein by reference.

REFERENCE SIGNS LIST

1 chip
11 film (release film)
11*a* liquid resin applying area
13 dispenser (ejecting mechanism)
14 nozzle
21 liquid resin
21*b* sealing resin
101 upper die
102 lower die
103 lower die base member
104 lower die cavity side member

105 elastic member
106 lower die cavity bottom surface member
111 fixed platen
112 movable platen
113 base
114 tie-bar (retaining member)
115 clamping mechanism
116 drive source
117 transmission member
510 release film cutting module (release film cutting mechanism)
511 film fixing member mounting mechanism
512 rolled release film
513 film gripper
520 applying module (ejecting mechanism and liquid resin spreading mechanism)
521 resin loader
522 aftertreatment mechanism
523 film fixing member moving mechanism
530 compression molding mechanism (compression molding module)
531 molding die
532 lower die cavity
540 conveying mechanism (conveying module)
541 substrate loader
542 rail
543 robot arm
544*a* substrate before resin sealing (substrate before molding)
544*b* resin-sealed substrate (molded substrate)
550 controller
701 frame
1000 film fixing member
1001 opening and folding member
1002 fixed side member
1003 pin (rotation axis)
1004 recessed part
1004*a* outer edge of recessed part 1004
1005 suction hole (suction part)
T target thickness of liquid resin after opening film
T0 ultimate target thickness of liquid resin
P1 dushed line surrounding a part of end of fixed side member 1002
P2 dushed line surrounding recessed part 1004

The invention claimed is:

1. A method for producing a resin molded product using a liquid resin applied on a film, comprising:
applying the liquid resin on the film, and
performing resin molding with the liquid resin applied in the step of applying the liquid resin, wherein
the step of applying the liquid resin comprises:
supplying the liquid resin on a part of a surface of the film on a side to be applied with the liquid resin;
spreading the liquid resin on the surface of the film on the side supplied with the liquid resin, by folding the film supplied with the liquid resin such that the liquid resin is on an inner surface of the film, and
opening the film folded in the step of spreading the liquid resin.

2. The method according to claim 1, wherein
the film is folded along a line passing thorough a center of a liquid resin supply area supplied with the liquid resin in the step of spreading the liquid resin.

3. The method according to claim 1, wherein
a target thickness of the liquid resin after being spread is preset, and
the liquid resin is spread such that a thickness of the liquid resin after being spread be equal to the target thickness in the step of spreading the liquid resin.

4. The method according to claim 1, comprising
fixing the film to a film fixing member, wherein
a recessed part is formed on a side of the film fixing member where the film is fixed so as to correspond to a liquid resin applying area to be applied with the liquid resin.

5. A film fixing member used in the step of applying the liquid resin in the method according to claim 4, configured to fix a film, wherein
a recessed part is formed on a side of the film fixing member where the film is fixed so as to correspond to a liquid resin applying area to be applied with the liquid resin.

6. A resin molding apparatus, comprising:
the film fixing member according to claim 5; and
a molding die configured to perform resin molding with the liquid resin applied in the step of applying the liquid resin.

7. A liquid resin spreading mechanism configured to perform the step of spreading the liquid resin and the step of opening the film in the method according to claim 1, by
spreading the liquid resin on a surface of the film on a side supplied with the liquid resin, by folding the film supplied with the liquid resin such that the side supplied with the liquid resin be inside, and
opening the film folded in the step of spreading the liquid resin.

8. A resin molding apparatus, comprising:
the liquid resin spreading mechanism according to claim 7; and
a molding die configured to perform resin molding with the liquid resin applied in the step of applying the liquid resin.

* * * * *